United States Patent
Bieselt et al.

(10) Patent No.: US 10,290,805 B2
(45) Date of Patent: May 14, 2019

(54) EMITTER AND METHOD FOR MANUFACTURING THE SAME

(71) Applicant: Infineon Technologies Dresden GmbH, Dresden (DE)

(72) Inventors: Steffen Bieselt, Stadt Wehlen (DE); Heiko Froehlich, Radebeul (DE); Thoralf Kautzsch, Dresden (DE); Maik Stegemann, Pesterwitz (DE); Mirko Vogt, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/888,515

(22) Filed: Feb. 5, 2018

(65) Prior Publication Data

US 2018/0159034 A1 Jun. 7, 2018

Related U.S. Application Data

(62) Division of application No. 15/079,472, filed on Mar. 24, 2016, now Pat. No. 9,887,355.

(30) Foreign Application Priority Data

Apr. 15, 2015 (DE) .................. 10 2015 206 745

(51) Int. Cl.
  *H01L 49/00* (2006.01)
  *G01J 3/00* (2006.01)
  *G01J 3/10* (2006.01)
  *G01J 3/42* (2006.01)

(52) U.S. Cl.
  CPC ............... *H01L 49/00* (2013.01); *G01J 3/00* (2013.01); *G01J 3/108* (2013.01); *G01J 3/42* (2013.01)

(58) Field of Classification Search
  CPC ..... G01J 3/00; G01J 3/108; G01J 3/42; H01L 49/00
  USPC ........... 257/84, 99, 80, 431; 438/54, 22, 704
  See application file for complete search history.

(56) References Cited

U.S. PATENT DOCUMENTS

| 7,019,364 | B1 * | 3/2006 | Sato .................. B82Y 20/00 257/347 |
| 7,923,794 | B2 | 4/2011 | Feyh |
| 9,214,604 | B2 * | 12/2015 | Ali .................. H01L 33/34 |
| 9,887,355 | B2 | 2/2018 | Bieselt et al. |
| 2006/0131651 | A1 | 6/2006 | Sato et al. |

(Continued)

FOREIGN PATENT DOCUMENTS

| DE | 103 42 800 A1 | 4/2005 |
| DE | 10 2004 032 176 A1 | 1/2006 |

(Continued)

*Primary Examiner* — Mohammed Shamsuzzaman
(74) *Attorney, Agent, or Firm* — Harrity & Harrity, LLP (57) ABSTRACT

A method for manufacturing an emitter comprises providing a semiconductor substrate having a main surface, the semiconductor substrate comprising a cavity adjacent to the main surface. A portion of the semiconductor substrate arranged between the cavity and the main surface of the semiconductor substrate forms a support structure. The method comprises arranging an emitting element at the support structure, the emitting element being configured to emit a thermal radiation of the emitter, wherein the cavity provides a reduction of a thermal coupling between the emitting element and the semiconductor substrate.

20 Claims, 10 Drawing Sheets

(56) References Cited

U.S. PATENT DOCUMENTS

2008/0272389 A1* 11/2008 Rogne .................... G01J 3/108
                                                    257/99
2008/0272689 A1   11/2008 Rogne
2016/0282259 A1*  9/2016 Kolb ................... G01N 29/022
2017/0146657 A1*  5/2017 Xu ......................... G01S 17/36

FOREIGN PATENT DOCUMENTS

DE    10 2004 032 489 A1    1/2006
DE         102007022509 A1    4/2018

* cited by examiner

EMITTER AND METHOD FOR MANUFACTURING THE SAME

RELATED APPLICATION

This application is a divisional of U.S. patent application Ser. No. 15/079,472, filed Mar. 24, 2016 (now U.S. Pat. No. 9,887,355), which claims priority under 35 U.S.C. § 119 to German Patent Application No. 102015206745.9, filed on Apr. 15, 2015, the contents of which are incorporated by reference herein in their entirety.

DESCRIPTION

Field

Embodiments of the present invention related to a method that may be used in emitter fabrication, in particular in fabrication of emitting thermal or infrared radiation. Further embodiments relate to an emitter and to a sensor comprising an emitter.

Background

IR-emitters (IR=infrared) allow for basic analysis of material systems in the scope of sensor technology. For example, solid materials, fluids or gases may be analyzed in the near and the medium infrared spectrum by examining an absorption of infrared radiation by the materials to be characterized. Substance-specific absorption spectra may be detected by a spectrometric unit. Based on a comparison with cataloged absorption characteristics a combination of substances and a concentration of single components may be determined.

SUMMARY

A method is provided that comprises: providing a semiconductor substrate having a main surface, the semiconductor substrate comprising a cavity adjacent to the main surface. A portion of the semiconductor substrate arranged between the cavity and the main surface of the semiconductor substrate forms a support structure. An emitting element is arranged at the support structure, the emitting element being configured to emit a thermal radiation of the emitter, wherein the cavity provides a reduction of a thermal coupling between the emitting element and the semiconductor substrate.

Further embodiments provide an emitter comprising a semiconductor substrate having a main surface, the semiconductor substrate comprising a cavity adjacent to the main surface. A portion of the semiconductor substrate arranged between the cavity and the main surface of the semiconductor substrate forms a support structure. An emitting element is arranged at the support structure, the emitting element being configured to emit a thermal radiation of the emitter. The cavity provides a reduction of a thermal coupling between the emitting element and the semiconductor substrate.

Before embodiments are described in detail using the accompanying figures, it is to be pointed out that the same or functionally equal elements are given the same reference numbers in the figures and that a repeated description for elements provided with the same reference numbers is omitted. Hence, descriptions provided for elements having the same reference numbers are mutually exchangeable.

DETAILED DESCRIPTION

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present invention. However, it will be apparent to those skilled in the art that embodiments of the present invention may be practiced without these specific details. In other instances, well known structures and devices are shown in block diagram form rather than in detail in order to avoid obscuring embodiments of the present invention. In addition, features of the different embodiments described hereinafter may be combined with each other, unless specifically noted otherwise.

Figure 1:
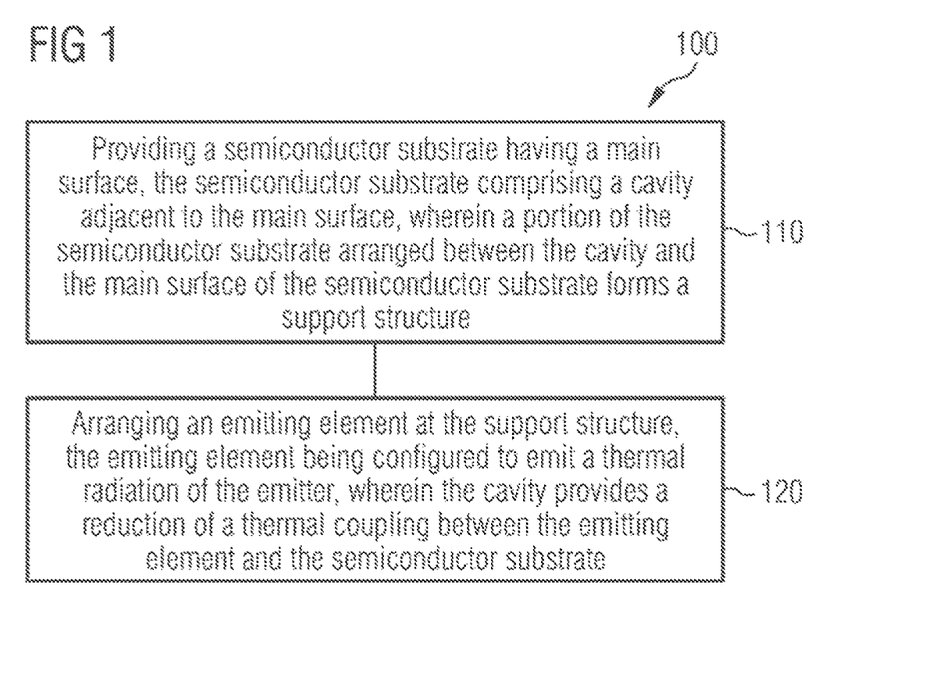
FIG. 1 schematically illustrates a process flow example of a method for manufacturing an emitter according to an embodiment.

FIG. 1 schematically illustrates a process flow example of a method 100 for manufacturing an emitter according to an embodiment. The method 100 comprises a step 110 in which a semiconductor substrate is provided. The semiconductor substrate comprises a main surface. The semiconductor substrate comprises a cavity adjacent to the main surface. A portion of the semiconductor substrate arranged between the cavity and the main surface of the semiconductor substrate may form a support structure. The semiconductor substrate may be, for example, a substrate comprising a silicon material and/or a Gallium Arsenide material. The semiconductor substrate may be, for example, a wafer to be processed.

The method 100 comprises a step 120 in which an emitting element is arranged at the support structure. The emitting element is configured to emit a thermal radiation of the emitter. The cavity may provide a reduction of a thermal coupling between the emitting element and the semiconductor substrate. The emitting element may comprise, for example, a conductive material arranged at the support structure. Alternatively or in addition, the emitting element may comprise a conductive element or structure configured for emitting the thermal radiation. Alternatively or in addition, the emitting element may be arranged by doping at least a portion of the support structure, for example using phosphor or boron.

The support structure may be formed of a portion of the semiconductor substrate. In particular, the support structure may be formed integrally with the semiconductor substrate. For example, the semiconductor substrate and the support structure may comprise a monocrystalline material or may be formed out of monocrystalline material. The thermal coupling between the emitting element and the semiconductor substrate allows for a reduced thermal coupling between the emitting element and the semiconductor substrate. For example, when the emitting element is configured for change (e.g. increase) a temperature of the emitting element when being activated, a thermal coupling between the emitting element and the semiconductor substrate may lead to losses and/or decreased efficiency of the emitter. By reducing the thermal coupling, an amount of such losses may also be decreased such that an efficiency of the emitter may be increased when compared to an emitter not comprising a thermal decoupling or may be high.

Figure 2:
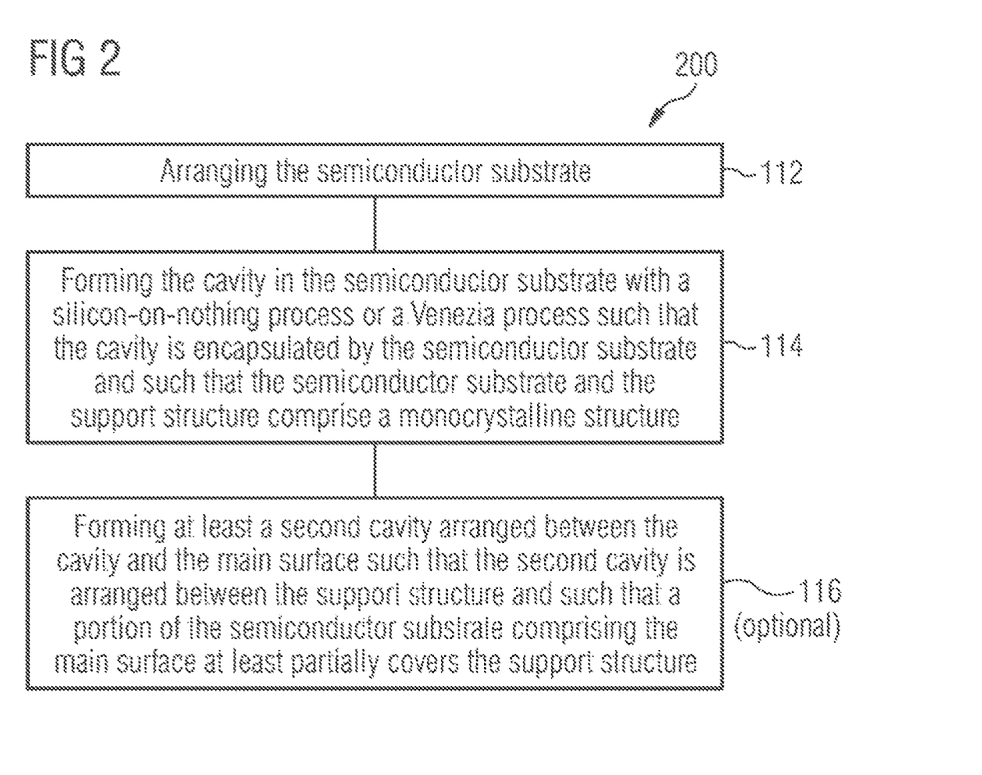
FIG. 2 schematically illustrates a process flow example of a method according to an embodiment, which may be used for at least partially implementing a step depicted in FIG. 1.

FIG. 2 schematically illustrates a process flow example of a method 200 which may be used for at least partially implementing the step 110 depicted in FIG. 1. The method 200 comprises a step 112 in which a semiconductor substrate is arranged. The semiconductor substrate may be, for example, a wafer comprising a semiconductor material, for example, a silicon material. The silicon material may comprise, for example, a monocrystalline structure.

In a step 114 of method 200 the cavity is formed in the semiconductor substrate. For forming the cavity in the semiconductor substrate, a so-called silicon-on-nothing (SON) process or a Venezia-process may be used. The cavity may be encapsulated in the semiconductor substrate. A structure of the semiconductor substrate and a structure of the support structure arranged between the cavity and the main surface may comprise the monocrystalline structure.

Step 110 may be performed before step 120. Alternatively, step 120 may be performed before step 110. For example, the emitting element may be arranged by doping at least partially the semiconductor material of the support structure. The cavity may be arranged by implementing the SON process and/or the Venezia process. During this process, the doping may be arranged during an epitaxial growth of the semiconductor material. Alternatively, before the epitaxial growth for forming the cavity, the conductive material or a conductive layer may be arranged at the support structure. I.e., the emitting element may be arranged during a forming the cavity such that the semiconductor substrate may be arranged comprising the emitting element.

The silicon-on-nothing process may also be referred to as an empty space in silicon (ESS) process and was designed by the Toshiba Corporation. The Venezia process was designed by STMicro Electronics nearly at the same time. Both processes may be similar, although they may differ in details. Based on regular silicon wafers, a plurality of trenches may be formed or opened. The trenches may be oxidized after an epitaxial growth. The etching step may be executed selectively or may be extended to all surfaces of a later chip. Oxidized buried channels and cavities which may be obtained inside the monocrystalline silicon allow for a manufacturing of cheap substrates, for example, silicon on insulator (SOI) substrates. After having formed the trenches, for example, by applying temperatures of, e.g., more than 1000° C., more than 1100° C. or more than 1200° C. and while applying a hydrogen material, the silicon material may recombine such that the cavity is formed inside the semiconductor substrate. The recombination may comprise an epitaxial growth and/or a doping of the material that recombines. A portion of the semiconductor substrate covering the cavity and being arranged between the cavity and the main surface may form the support structure.

An optional step 116 of the method 200 comprises forming at least a second cavity arranged between the cavity and the main surface such that the second cavity is arranged between the support structure and such that a portion of the semiconductor substrate comprising the main surface at least partially covers the support structure. Simplified, the portion of the semiconductor substrate comprising the main surface may be arranged to cover the support structure at least partially having the second cavity between the main surface and the support structure. This allows for a protection of the emitting element from an environmental influence and/or for a protection of mechanical influences. In particular, losses due to convection and/or thermal conduction may be reduced by arranging at least the second cavity. Alternatively or in addition, further cavities may be arranged between the support structure and the main surface and or between the cavity and the semiconductor substrate. Alternatively or in addition further cavities may be arranged laterally spaced to the cavity.

Figure 3:
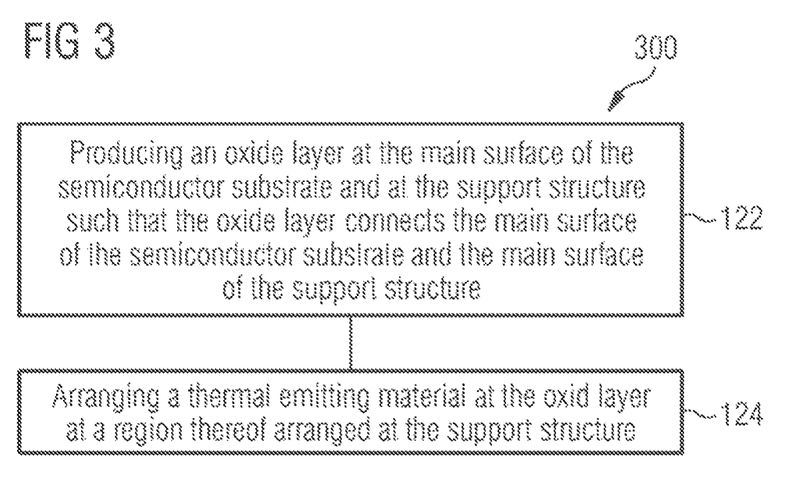
FIG. 3 schematically illustrates a process flow example of a method according to an embodiment, which may be used for at least partially implementing another step depicted in FIG. 1.

FIG. 3 schematically illustrates a process flow example of a method 300 according to an embodiment. The semiconductor substrate may be used, for example, for arranging the emitting element according to step 120 described with respect to method 100. The method 300 comprises step 122 in which an oxide layer is produced at the main surface of the semiconductor substrate and at the support structure such that the oxide layer connects the main surface of the semiconductor substrate and the main surface of the support structure.

In step 124 of method 300 a thermal emitting material is arranged at the oxide layer at a region thereof arranged at the support structure. The emitting material may be configured for emitting the thermal radiation when being activated which may comprise, for example, being subjected to an electric current.

Alternatively, the emitting element may be arranged by doping at least a portion of the support structure such that the support structure may be used as an emitting element at the doped regions thereof.

Figure 4:
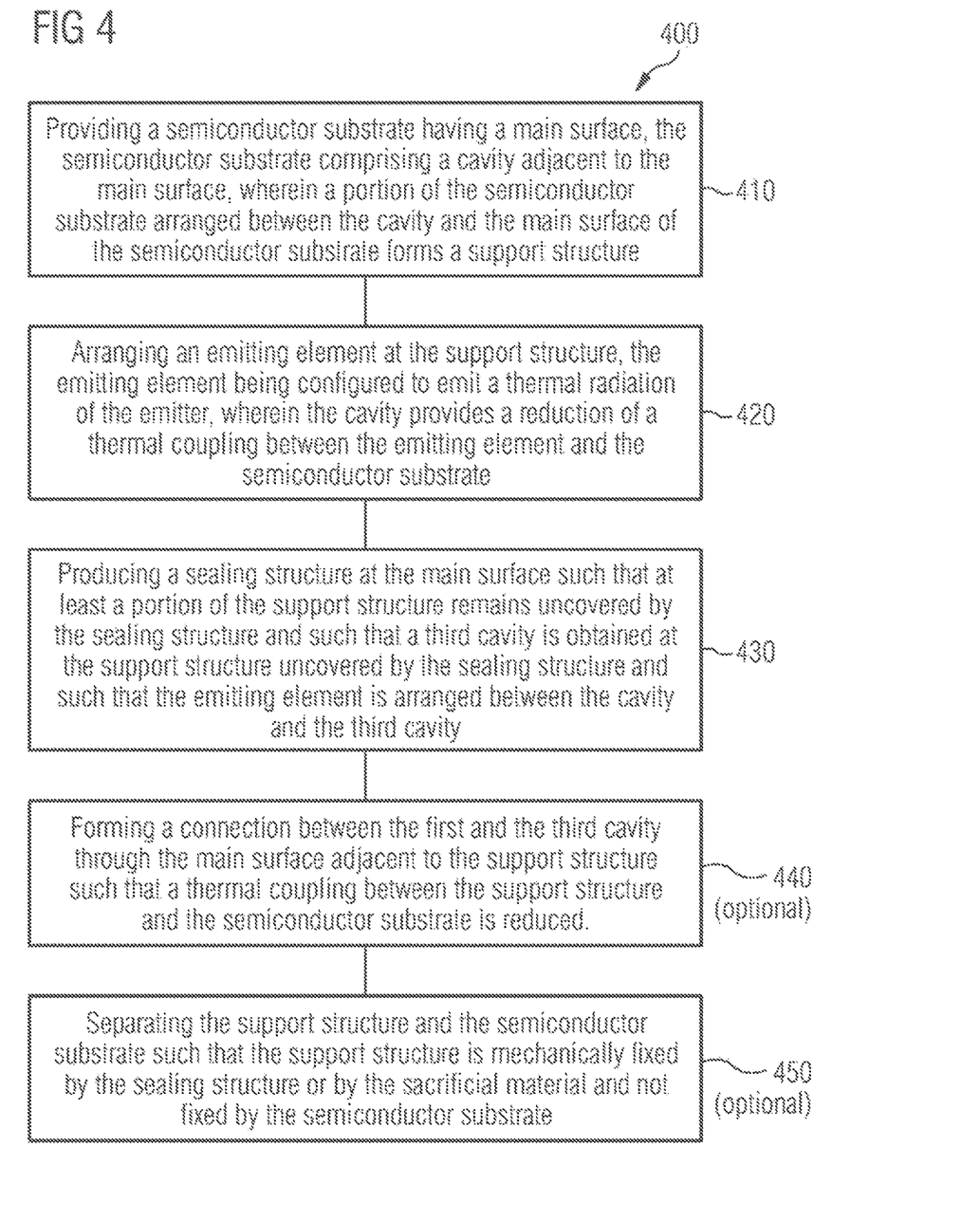
FIG. 4 schematically illustrates a process flow example of a further method for manufacturing an emitter according to an embodiment.

FIG. 4 schematically illustrates a process flow example of a method 400 for manufacturing an emitter according to an embodiment. In step 410 a semiconductor substrate having a main surface is provided. The semiconductor substrate comprises a cavity adjacent to the main surface, wherein a portion of the semiconductor substrate arranged between the cavity and the main surface of the semiconductor substrate forms a support structure. For example, step 410 may be step 110.

In step 420 of the method 400 an emitting element is arranged at the support structure. The emitting element is configured to emit a thermal radiation of the emitter. The cavity provides a reduction of a thermal coupling between the emitting element and the semiconductor substrate. For example, step 420 may be step 120.

In step 430 of the method 400 a sealing structure may be produced at the main surface of the semiconductor substrate. The sealing structure may be produced such that at least a portion of the support structure remains uncovered by the sealing structure and such that a (third) cavity is obtained at the support structure uncovered by the sealing structure. Simplified, the third cavity may be arranged outside the semiconductor substrate between the main surface and the sealing structure. The sealing structure may be produced such that the emitting element is arranged between the cavity and the third cavity. When compared to the second cavity described with reference to FIG. 2, the third cavity may be arranged at least partially outside the semiconductor substrate, wherein the second cavity obtained in step 116 may be arranged at least partially inside the semiconductor substrate. The sealing structure may allow for protection of the emitting element. The third cavity may allow for a reduction or minimization of losses due to convection and thermal conduction.

In an optional step 440 of the method 400 a connection (opening of the semiconductor substrate) between the first cavity and the third cavity may be formed through the main surface of the semiconductor substrate. The connection may be formed adjacent to the support structure, i.e., at a lateral position through the main surface next to the support structure, such that a thermal coupling between the support structure and the semiconductor substrate is reduced. Simplified, by forming the opening between the cavities the material of the semiconductor substrate and/or of the support structure may be partially removed between the support structure and the semiconductor substrate such that a thermal coupling and a thermal conduction between the support structure and the semiconductor substrate may be reduced by the opening. Step 440 may also be performed after step 116 for forming a connection between the first and the second cavity.

In an optional step 450 of the method 400 the support structure and the semiconductor substrate may be separated from each other such that the support structure is mechanically fixed by the sealing structure or by a sacrificial material arranged between the sealing structure and the main surface. The support structure and the semiconductor substrate may be separated such that the support structure is not fixed by the semiconductor substrate. For example, the support structure and the semiconductor substrate may be separated from each other at a first portion (trench). The support structure and the semiconductor substrate may be covered (reconnected) at least partially, for example, by a sealing material arranged at the main surface. The support structure and the semiconductor substrate may be fixed (mechanically connected) to each other by the sealing material. Afterwards, a remaining portion of the semiconductor material between the support structure and the semiconductor substrate may be removed, such that the support structure and the semiconductor substrate are not fixed (connected) to each other by the semiconductor material of the semiconductor substrate.

Additionally, between the main surface and the sealing material a cavity may be arranged, for example, the third cavity. This may provide a further increasing of the thermal decoupling between the support structure and the semiconductor substrate.

Figure 5A:
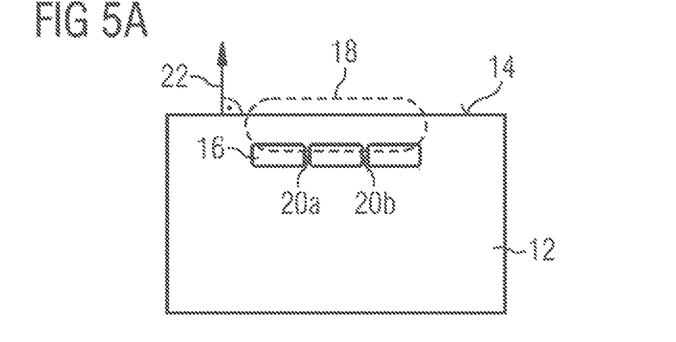
FIG. 5a shows a schematic cross-sectional view of a semiconductor substrate according to an embodiment.

FIG. 5*a* shows a schematic cross-sectional view of a semiconductor substrate 12 according to an embodiment. The semiconductor substrate 12 comprises a main surface 14. The main surface 14 may be the main surface of the semiconductor substrate 12 (e.g., a wafer) comprising the closest distance to a cavity 16. The semiconductor substrate 12 may be obtained by a silicon-on-nothing process, i.e., the semiconductor substrate 12 may be referred to as a silicon-on-nothing structure.

For example, the semiconductor substrate 12 may be a semiconductor wafer. For example, but without limitation, a wafer may comprise a first and a second main surface. The main surfaces may be a top and a bottom surface, wherein the terms top and bottom are used for the sake of clarity and may be exchanged with any other nomination, especially when rotating the wafer.

A portion of the semiconductor substrate 12 arranged between the cavity 16 and the main surface 14 forms a support structure 18. Between the support structure 18 and the semiconductor substrate 12 two pillar structures 20*a* and 20*b* may extend through the cavity 16. The pillar structures 20*a* and 20*b* may be formed integrally with the support structure 18 and the semiconductor substrate 12. The pillar structures 20*a* and 20*b* may extend at least partially along a (thickness) direction parallel to a surface normal 22 of the main surface 14. Simplified and by non-limiting example only, when the main surface 14 is referred to a as a top surface, the pillar structures 20*a* and 20*b* may be arranged below the support structure 18.

Figure 5B:
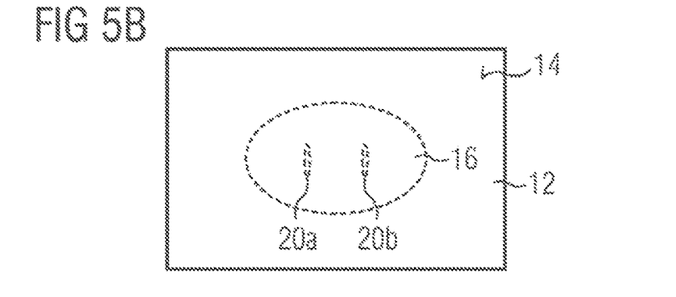
FIG. 5b schematically illustrates as top view of the semiconductor substrate shown in FIG. 5a according to an embodiment.

FIG. 5*b* schematically illustrates as top view of the semiconductor substrate 12 shown in FIG. 5*a*. The dotted lines indicate that the pillar structures 20a and 20b and the cavity 16 may be buried inside the semiconductor substrate 12 and covered by the main surface 14.

Figure 5C:
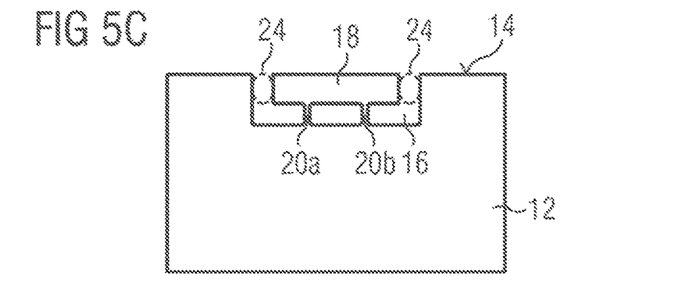
FIG. 5c shows a schematic cross-sectional view of the semiconductor substrate, wherein at least one trench is formed at a main surface and extending to a cavity according to an embodiment.

FIG. 5c shows a schematic cross-sectional view of the semiconductor substrate 12, wherein at least one trench 24 is formed at the main surface 14 and extending to the cavity 16. When referring to FIG. 5b, the at least one trench 24 may be arranged along or adjacent to an outer circumference of the cavity 16 (dotted line in FIG. 5b). The support structure 18 may at least partially be separated from the semiconductor substrate 12 with the exception of the pillar structures 20a and 20b. At a region of the at least one trench 24 a thermal coupling between the support structure 18 and the semiconductor substrate 12 may be reduced. The at least one trench 24 may also comprise one or more holes only partially separating the support structure 18 and the semiconductor substrate 12 at the main surface 14.

Simplified, the pillar structures 20a and 20b provide a minimized thermal contact. The pillar structures 20a and 20b may comprise any cross-section profile. For example, a cross-section profile may comprise a round, an elliptical or a polygon shape. Alternatively or in addition, the cavity 16 may comprise any cross-section profile such as round, elliptical or polygon.

Figure 5D:
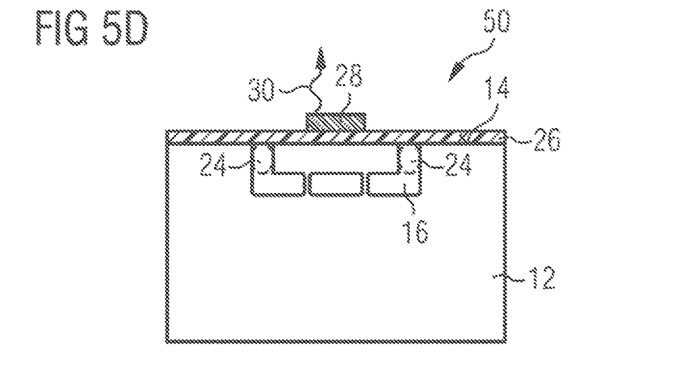
FIG. 5d shows a schematic cross-sectional view of an emitter which may be obtained when arranging an insulating layer at the main surface and at the support structure according to an embodiment.

FIG. 5d shows a schematic cross-sectional view of an emitter 50 which may be obtained when arranging an insulating layer 26 at the main surface 14 and at the support structure 18. The insulating layer 26 may comprise an electrical and/or thermally insulating material such as an oxide material. The insulating layer 26 may be arranged, for example, by a so-called high-density plasma process (high-density plasma—HDP). The insulating layer 26 may cover the at least one trench 24 such that the cavity 16 may be sealed by the insulating layer 26. This may allow for low thermal losses of the structure. An emitting element 28 is arranged at the insulating layer 26 and configured for emitting a thermal radiation 30 when being activated. Alternatively or in addition, the insulating layer 26 may comprise a PSG (phosphor silicate glass) material.

The thermal conductivity of the insulating material of the insulating layer 26 may be lower when compared to a thermal conductivity of the semiconductor substrate. The thermal conductivity of the insulating material may be lower by a factor (or quotient) of 10 or more, i.e., one order of magnitude, lower by a factor (or quotient) of 100 or more, i.e., two orders of magnitude, lower than a factor of 100, a value between 50% and 0.1% or less.

The emitting element 28 may comprise a conductive material such as a metal or a semiconductor material. For example, the emitting material may comprise a wolfram (tungsten) material, a gold material, a copper material, an aluminum material or the like. Alternatively, the emitting element may comprise, for example, a doped or undoped polysilicon. The insulating layer 26 may provide an electric and/or thermal insulation of the emitting element 28 and the semiconductor substrate 12. The insulating layer 26 may form a cap structure of the semiconductor substrate 12 and may allow for a sealing of the cavity 16. The emitter 50 may be operated as an infrared-emitter.

In other words, the emitter 50 is a simple embodiment. Primarily losses due to thermal conduction into the substrate are reduced or avoided.

Figure 6A:
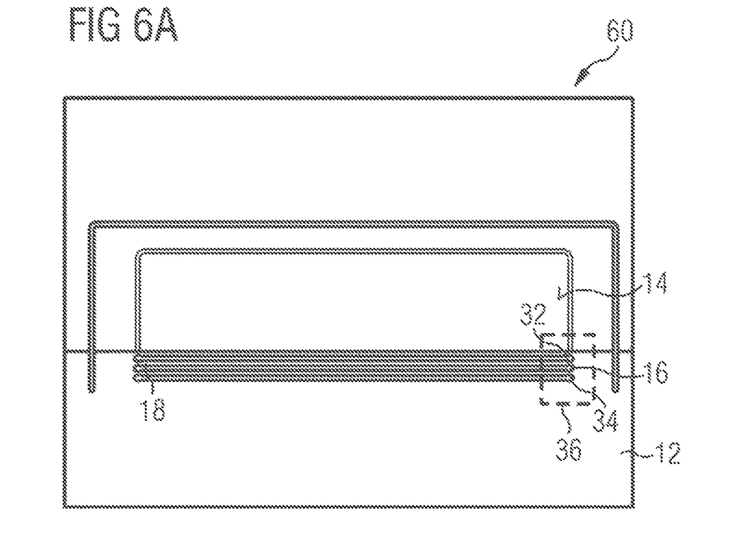
FIG. 6a shows a picture of an emitter according to an embodiment.

FIG. 6a shows a picture of an emitter 60 according to an embodiment. The emitter 60 comprises the cavity 16, a second cavity 32 and a further cavity 34. The second cavity 32 and the further cavity 34 may be obtained, for example, when performing step 116. During a SON process or a Venezia process, a plurality of cavities may be obtained along the thickness direction. The second cavity 32 may be arranged between the cavity 16 and the main surface 14. The support structure 18 may comprise a portion thereof comprising a doped silicon material and forming the emitting element. A shape of the support structure and/or of other structures of the semiconductor substrate 12 arranged between cavities and/or the main surface may be according to a lamella-structure. A section 36 of FIG. 6a is illustrated in more detail in FIG. 6b.

Figure 6B:
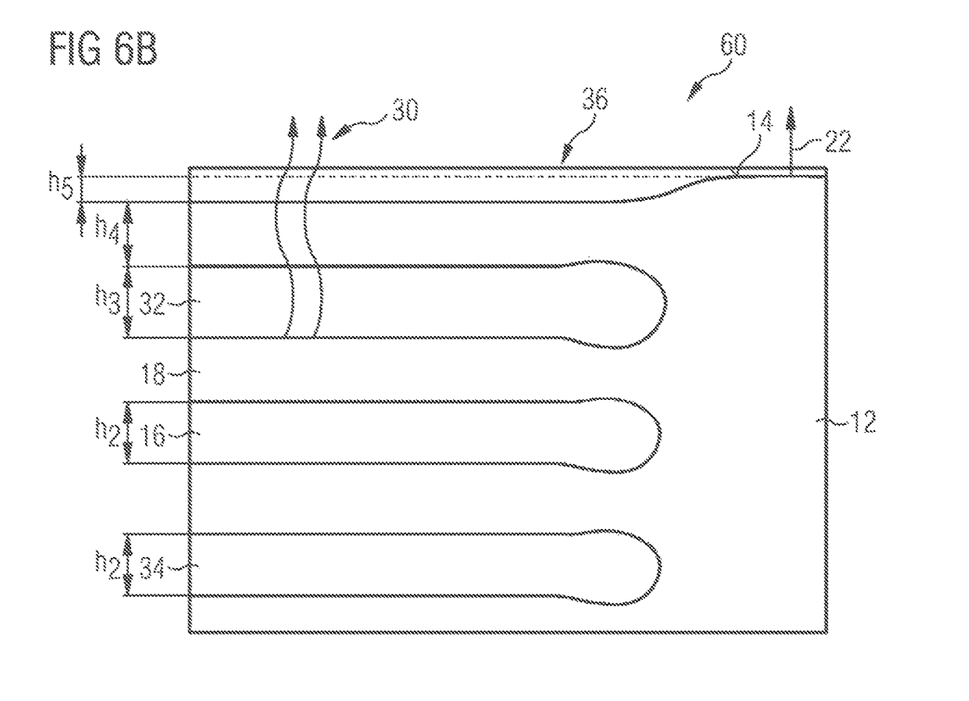
FIG. 6b shows a detailed view of a section of the emitter illustrated in FIG. 6a according to an embodiment.

FIG. 6b shows a detailed view of the section 36 of the emitter 60. Between the support structure 18 and the main surface 14 the second cavity 32 is arranged. An extension $h_1$ along the thickness direction parallel to the surface normal 22 of the main surface 14 may be, for example, approximately 1 µm, such as 1.08 µm. The cavity 16 may comprise an extension $h_2$ along the direction parallel to the surface normal 22, which is approximately 1.1 µm, such as 1.12 µm. The second cavity 32 may comprise an extension $h_3$ along the direction parallel to the surface normal 22, which is, for example, approximately 1.3 µm, such as 1.29 µm. An extension $h_4$ of the semiconductor substrate arranged between the main surface 14 and the second cavity 32 may be, for example, approximately 1.2 µm, such as 1.234 µm. An extension $h_5$ along the direction parallel to the surface normal 22 may be approximately 0.5 µm, for example, 0.503 µm. The extension $h_5$ may be a so-called lowering of the main surface 14, wherein the lowering may be obtained, for example, during the silicon-on-nothing process or the Venezia-process. The extensions $h_1$-$h_4$ may comprise a value that is greater than or equal to 20 nm and smaller than or equal 1 mm, greater than or equal to 100 nm and smaller than or equal to 100 µm or greater than or equal to 1 µm and smaller than or equal 10 µm. The extension $h_5$ may comprise a value that is greater than or equal to 0 nm and smaller than or equal 1 mm, greater than or equal to 10 nm and smaller than or equal 10 µm or greater than or equal to 100 nm and smaller than or equal 5 µm.

In other words, FIGS. 6a and 6b show a multilayer-SON-structure. The structure provides the possibility to realize a covering of the emitter already during the hydrogen-tempering (SON-process).

Figure 7A:
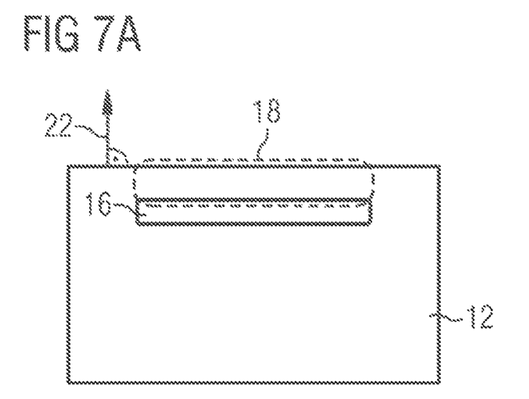
FIG. 7a illustrates a schematic cross-sectional view of the semiconductor substrate comprising the cavity according to another embodiment

FIG. 7a illustrates a schematic cross-sectional view of the semiconductor substrate 12 comprising the cavity 16. When compared to the cross-sectional view illustrated in FIG. 5a, the semiconductor substrate 12 may be formed without the pillar structures 20a and 20b.

Figure 7B:
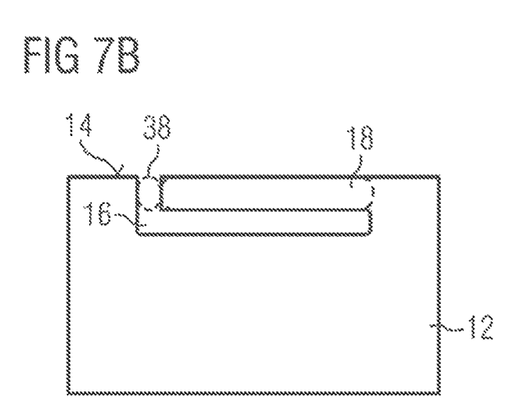
FIG. 7b shows a schematic cross-sectional view of the semiconductor substrate depicted in FIG. 7a, wherein a trench is formed between the main surface and the cavity according to an embodiment.

FIG. 7b shows a schematic cross-sectional view of the semiconductor substrate 12 depicted in FIG. 7a, wherein a trench 38 is formed between the main surface 14 and the cavity 16. The trench 38 is formed such that at least one connection between the support structure 18 and the semiconductor substrate 12 remains. The trench 38 may be obtained, for example, by a laser cutting process or an etching process such as a dry etching process or a wet etching process.

Figure 7C:
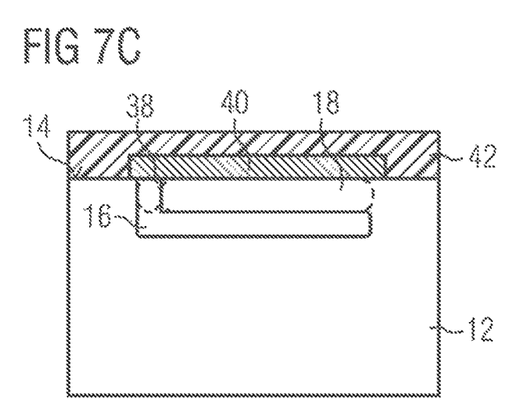
FIG. 7c shows a schematic cross-sectional view of the semiconductor substrate depicted in FIG. 7b, wherein a sacrificial material is arranged at the main surface according to an embodiment.

FIG. 7c shows a schematic cross-sectional view of the semiconductor substrate 12 depicted in FIG. 7b, wherein a sacrificial material 40 is arranged at the main surface 14. The sacrificial material 40 is arranged such that the trench 38 is covered by the sacrificial material 40 partially or completely. Additionally, the support structure 18 may be covered at least partially by the sacrificial material 40. The sacrificial material 40 may be, for example, a carbon material or another material, which may be removed selectively (i.e., faster or with a higher removal rate) with respect to the semiconductor substrate and with respect to a sealing material 42. The sealing material 42 may be arranged at the main surface 14 and may cover the sacrificial material 40. Simplified, FIG. 7c shows an arrangement of a carbon cap and of a sealing. The sealing material 42 may cover the sacrificial material 40 partially or completely such that the sacrificial material 40 forms a space or volume of a cavity in the sealing material 42. The sacrificial material 40 may additionally be arranged at the trench 38 and may prevent the sealing material 42 from reaching the cavity 16.

Figure 7D:
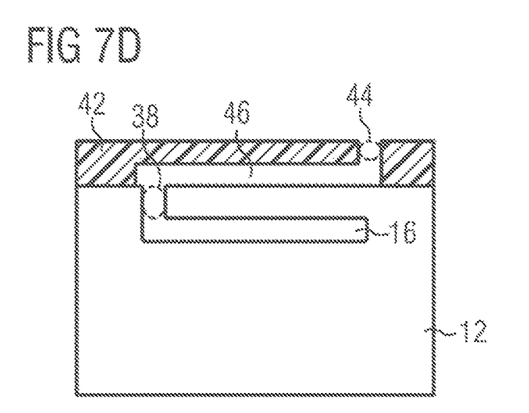
FIG. 7d shows a schematic cross-sectional view of the semiconductor substrate depicted in FIG. 7c, wherein an opening is formed in a sealing material according to an embodiment.

FIG. 7d shows a schematic cross-sectional view of the semiconductor substrate 12 depicted in FIG. 7c, wherein an opening 44 (trench) is formed in the sealing material 42. The trench 44 may be formed in the sealing material 42 such that the sacrificial material 40 is accessible by an etching process configured to remove the sacrificial material at least partially, preferably completely. The sacrificial material 40 may be removed by the etching process with a higher etching rate compared to the semiconductor substrate 12 and/or the sealing material 42. This may allow for removing the sacrificial material 40 even from large distances without damaging the remaining structure unacceptably. At a location where the carbon material has been removed a third cavity 46 may be generated. The third cavity 46 and the cavity 16 may be connected by the trench 38 such that the trench 38 may be denoted as a connection between the cavity 16 and the third cavity 46.

Figure 7E:
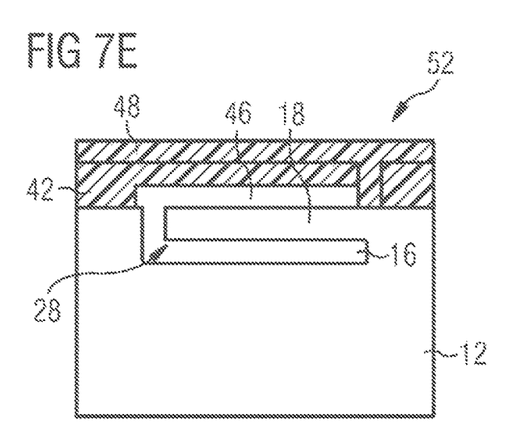
FIG. 7e shows a schematic cross-sectional view of the semiconductor substrate depicted in FIG. 7d, wherein a further sealing material is arranged at the sealing material according to an embodiment.

FIG. 7e shows a schematic cross-sectional view of the semiconductor substrate 12 depicted in FIG. 7d, wherein a further sealing material 48 is arranged at the sealing material 42 such that the opening 44 may be closed. The sealing material 42 may be an oxide material. The sealing material 42 and/or 48 may be arranged or generated as it was described with respect to the insulating layer 26. The sealing material 42 and the sealing material 48 may be equal. Alternatively, the sealing material 42 may be different from the sealing material 48, e.g., a different material oxidized and/or comprise a different structure (amorphous, crystalline or the like). The sealing materials 42 and/or 48 may be transparent with respect to the thermal radiation 30.

The cavities 16 and 46 may be sealed by the sealing material 42 and/or the sealing material 48. Optionally, the cavities 16 and/or 46 may be evacuated at least partially, i.e., the cavities 16 and/or 46 may comprise a different pressure when compared to an ambient condition of the semiconductor substrate 12. Alternatively or in addition, a gas or a liquid may be filled into the cavities 16 and/or 46. The sealing materials 42 and 48 may form a sealing structure 52 configured to seal the cavities 16 and/or 46 with respect to an environment of the semiconductor substrate 12. The sealing structure 52 may be configured, for example, to seal the cavities 16 and 46 hermetically and/or maintain a condition such as a pressure inside the cavities 16 and/or 46. The cavities 16 and 46 may be evacuated before sealing the cavities. A pressure may be, for example, for example, less than 100 millitorr, less than 20 millitorr or less than 10 millitorr such as 1 millitorr.

The emitting element 28 may be, for example, at least a portion of the support structure 18 comprising a doping. By sealing the cavities 16 and 46, the emitting element 28 may be encapsulated and sealed. This allows for a high degree of reduction of losses due to convection (e.g., airflow transporting thermal energy may be prevented) and thermal coupling (a low amount of gas molecules or even a vacuum may reduce or minimizes thermal coupling).

Figure 7F:
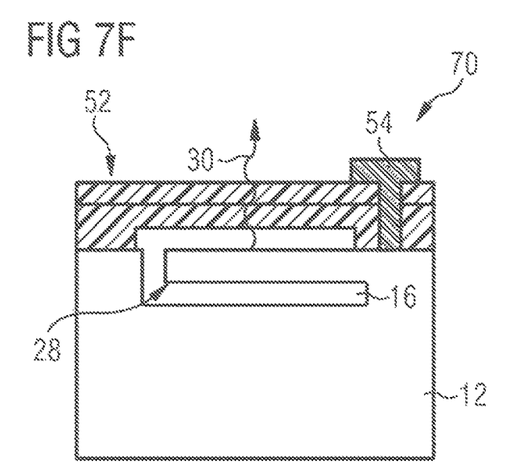
FIG. 7f shows a schematic cross-sectional view of an emitter according to an embodiment.

FIG. 7f shows a schematic cross-sectional view of an emitter 70 which may be obtained, for example, when arranging a conductive structure (electric connection) 54 through the sealing structure 52. The conductive structure 54 may comprise, for example, a conductive material such as a metal (e.g., silver, gold, copper or the like) through the sealing structure 52 for providing an electric contact to the emitting element 28. For example, an electric contact may be provided to the semiconductor substrate 12 or a doped region thereof when the semiconductor substrate 12 is a doped semiconductor material. The conductive structure 54 allows for a lateral electric connection of the emitting element.

In other words, a linkage (connection) of the emitter with an oxide bridge may be realized simultaneously with a processing of the sealing structure. After arranging the sacrificial layer, an HDP-oxide cap may be deposited. The cap may cover trenches between the emitter and the substrate at an upper side (i.e., adjacent to the main surface 14).

In the following, reference will be made to FIGS. 8a-f depicting a method for manufacturing an emitter 80. The first steps depicted in FIGS. 8a-c may be equal to the steps described with reference to FIGS. 7a-c, i.e., the semiconductor substrate 12 depicted in FIG. 8c may be equal to the semiconductor substrate 12 depicted in FIG. 7c.

Figure 8A:
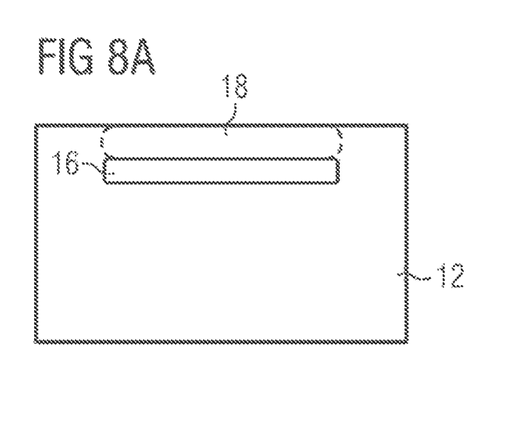
FIG. 8a shows the cross-sectional view illustrated in FIG. 7a according to an embodiment.
Figure 8B:
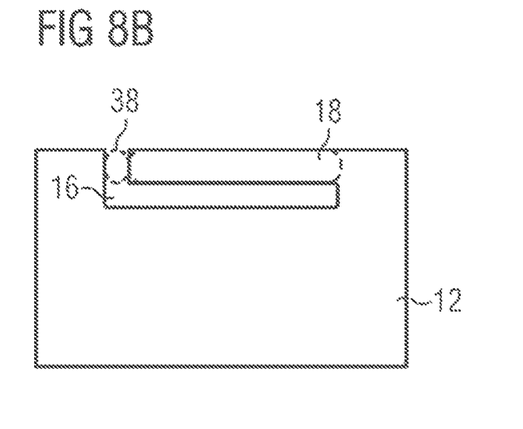
FIG. 8b shows the cross-sectional view illustrated in FIG. 7b according to an embodiment.
Figure 8C:
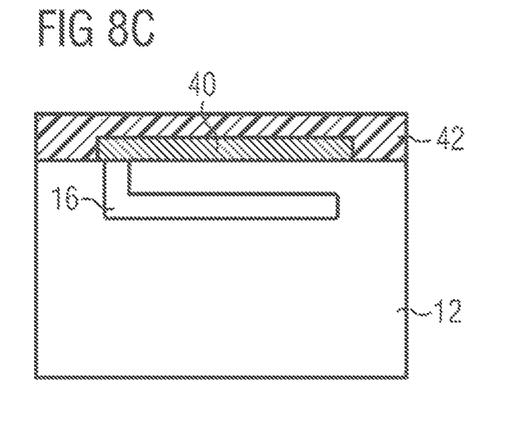
FIG. 8c shows the cross-sectional view illustrated in FIG. 7c according to an embodiment.
Figure 8D:
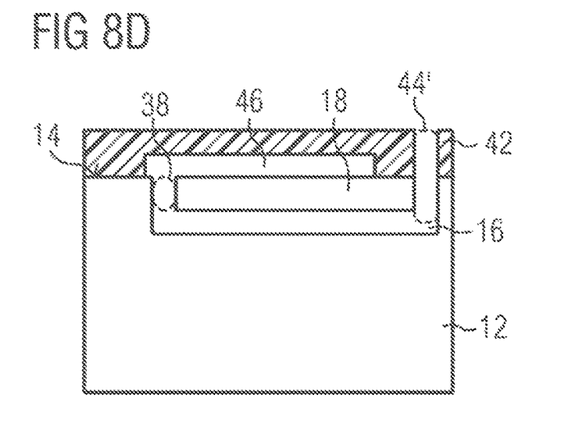
FIG. 8d shows a schematic cross-sectional view, which may be obtained, for example, when a trench is formed through the sealing material arranged in FIG. 8c according to an embodiment.

FIG. 8d shows a schematic cross-sectional view, which may be obtained, for example, when a trench 44' is formed through the sealing material 42 and extending through the main surface 14 into the semiconductor substrate 12. The trench 44' may be formed such that it extends to the cavity 16. The trench 44' may be formed at a lateral position adjacent to the support structure 18, i.e., it may extend through the semiconductor substrate such that it releases at least a portion of the support structure 18 from a remaining portion of the semiconductor substrate. By forming the trench 44' a remaining portion of the semiconductor substrate 12 forming a connection between the support structure 18 and the semiconductor substrate 12 (e.g. not removed by the trench 38) may be removed partially or completely. The support structure 18 may be separated from the semiconductor substrate 12 with the exception of the sealing material 42.

Simplified, the support structure may be mechanically fixed to the semiconductor substrate 12 by the sealing material 42 and may be not fixed by the semiconductor substrate 12. The sealing material 42 may be the material of the insulating layer 26. For example, the sealing material 42 may comprise a lower thermal conductivity when compared to the thermal conductivity of the semiconductor substrate 12 as was described above with respect to the insulating layer 26. By completely separating the support structure 18 and the semiconductor substrate 12 with the exception of the sealing material 42 a thermal loss may further be reduced.

Figure 8E:
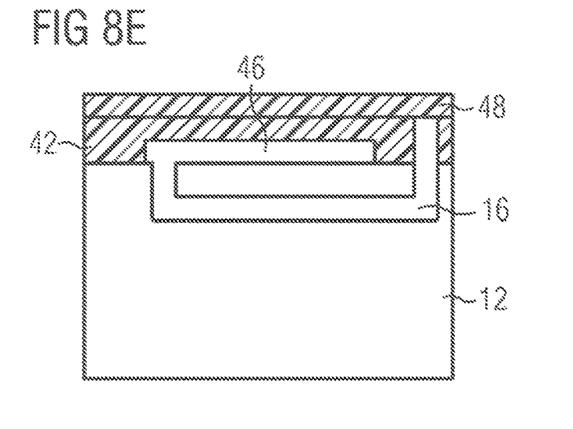
FIG. 8e shows a schematic cross-sectional view of the semiconductor substrate depicted in FIG. 8d after the sealing material is arranged as it is described with respect of FIG. 7e according to an embodiment.

FIG. 8e shows a schematic cross-sectional view of the semiconductor substrate 12 depicted in FIG. 8d after the sealing material 48 is arranged as it is described with respect of FIG. 7e, wherein the sealing structure 52 may cover and/or close (seal) the trench 44'. The cavities 16 and 46 may be evacuated at least partially and closed with respect to an environment of the semiconductor substrate 12.

Figure 8F:
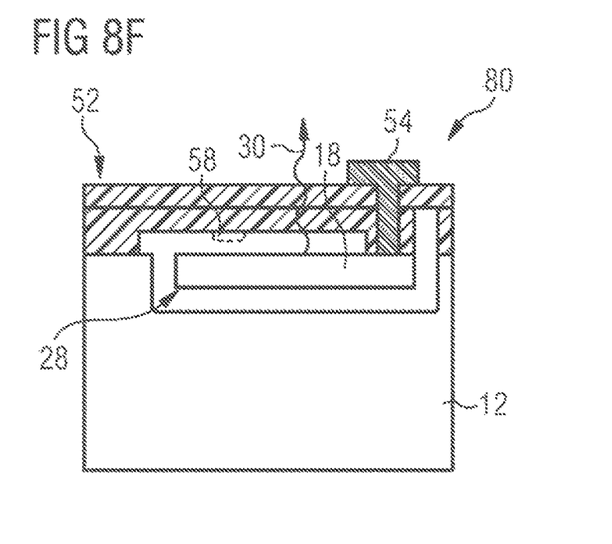
FIG. 8f shows a schematic cross-sectional view of an emitter 80 according to an embodiment obtained after a conductive element according to an embodiment.

FIG. 8f shows a schematic cross-sectional view of the emitter 80 obtained after the conductive structure 54 is arranged such that the support structure 18, the emitting element 28, respectively, may be electrically connected. Simplified, a connection 44 or 44' may be formed between the cavity 16 and the third cavity 46 through the main surface 14 adjacent to the support structure 18. This allows for a thermal coupling between the support structure 18 and the semiconductor substrate 12 to be reduced.

Evacuation of the cavities 16 and/or 46 sealed by the sealing structure 52 may be obtained, for example, when arranging the sealing structure 52 at least partially when an evacuated environment is present, for example, in a vacuum chamber. Alternatively or in addition, the sealing structure 52 may comprise a getter material configured to absorb gas molecules present in the cavities sealed by the sealing structure 52. The getter material may be activated (i.e., the cavities may be evacuated) after the cavities have been sealed. An activation of the getter material may be performed, for example, by applying a temperature. For example, evacuation may be obtained after (first) activating the emitting element after sealing.

Although the emitter 80 is described as the support structure 18 only being connected to the semiconductor substrate 12 by the sealing structure 52, also a residual portion of the sacrificial material 40 may form a connection when not being removed.

Although above-described embodiments relate to an emitter for emitting thermal radiation and/or an infrared radiation (IR-emitter), other embodiments may also relate to an emitter for emitting electromagnetic radiation comprising a wavelength different from a wavelength of the infrared or near infrared range. I.e., other sources of electromagnetic radiation may be arranged as emitting element such as a light source.

The emitters 70 and 80 may alternatively comprise an at least partially uncovered emitting element 28, i.e., the emitting element 28 may not be sealed (completely). This may be advantageous, for example, when the emitter is arranged in a sensor for sensing a thermocoupling of gases. When the emitting element 28 is uncovered (not sealed), the gas to be sensed may reach one or more cavities and may contact the emitting element such that the thermal radiation travels through the material (gas). This may allow for integrated sensors. For example, the emitter 50, 60, 70 or 80 may comprise a sensor element 58 configured for sensing a spectral absorption of the material. The sensor element 58 may be arranged, for example, at the sealing structure 52 or at the sealing material 42, for example, when the sealing material 48 is not present.

Embodiments refer to an integrated sensor comprising an emitter and a sensor element configured for sensing or detecting a spectral absorption of the thermal radiation emitted by the emitting element.

Figure 9:
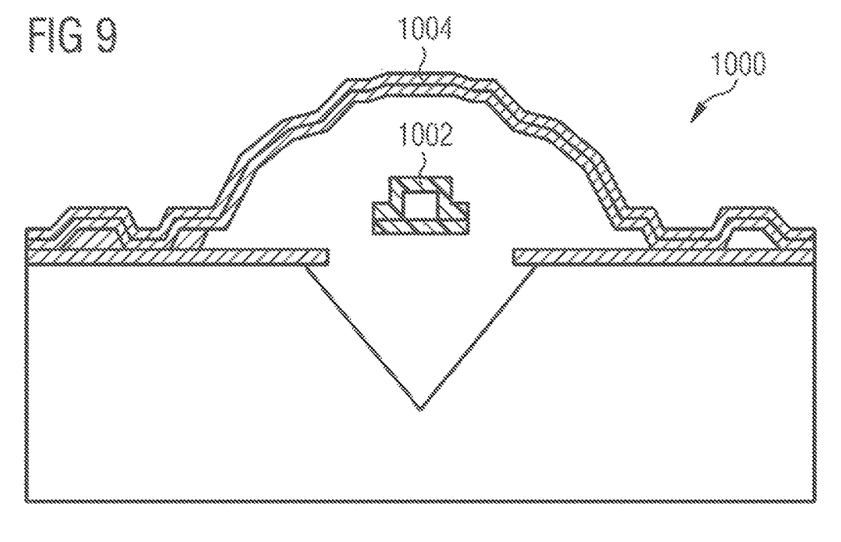
FIG. 9 shows a schematic cross-sectional view of an infrared emitter being formed as discreet element according to a known concept.

Above-described embodiments may provide a manufacturing process with a low complexity when compared to known concepts. Referring now to FIG. 9, showing a schematic cross-sectional view of an infrared emitter being formed as discreet and not miniaturized element, a nitride coated polysilicon filament 1002 is used for emitting infrared radiation through a silicon nitride window 1004. Such a process may require a plurality of etching steps, generating a polysilicon element and covering the polysilicon element. A silicon substrate is structured by a wet-chemical etching. Afterwards, an IR-emitter (poly-silicon) is embedded in a PSG-sacrificial layer (PSG; phosphor silicate glass) after a structuration of a nitride layer, the sacrificial layer is removed and the cavity is evacuated and sealed. This concept requires a high complexity and generating polysilicon elements. Especially the combination of a generation of the heating element and an evacuation is not solved sufficiently, yet. Above described embodiments may be obtained in contrast by structuring the semiconductor substrate which may allow for a simple and precise process.

Figure 10:
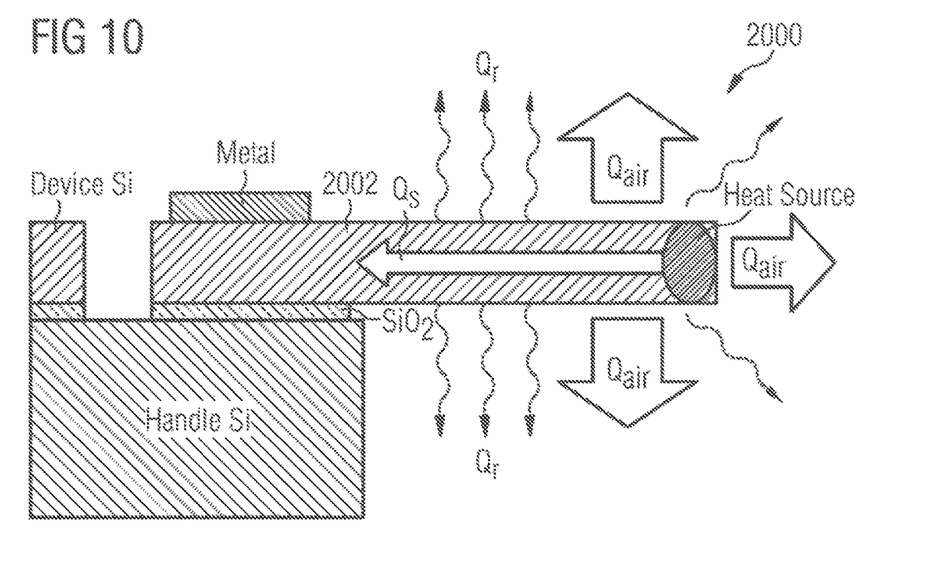
FIG. 10 shows an IR-emitter according to a known concept.

Referring now to FIG. 10, showing an IR-emitter 2000 according to a known concept, the IR-emitter uses a SOI-wafer (SOI=Silicon on insulator) as basic material of the integration concept. A cantilever structure 2002 is structured out of an upper silicon layer. The concept suffers from a high thermal conduction and thus a low efficiency.

Above described embodiments may allow for a thermal insulation by the oxide layer 26 and/or by sealing cavities and thus for efficient emitters.

The known concepts shown in FIGS. 9 and 10 use burdensome, partially costly sequence of integration. Above-described embodiments may, when compared to known concepts, be integrated into a CMOS process such that the manufacturing of the emitters may be integrated into existing production processes.

In other words, above-described embodiments allow for an integration of a structural element comprising silicon as a heating element (emitting element) for an infrared-emitter. This may comprise using a silicon-on-nothing process (Venezia-process) for structuring a high-ohmic, exposed silicon element (support structure). This silicon element may be provided a cap (coverage) by using a carbon-sacrificial layer-process. The cap may comprise an oxide or a different appropriate material. Based on an evacuating sealing process the emitting structure may be encapsulated. Above-described embodiments allow for generating an infrared-emitter using approved and inexpensive processes and materials. Further, even an evacuated emitter element may be generated.

The silicon-on-nothing-layer may be defined in its doping and its conductivity by means of epitaxial growth previous to its generation and according to an embodiment. A geometry, especially a height of the cavities (extensions along the direction parallel to the surface normal of the main surface) may be chosen such that an emission of selected spectral ranges may be supported, for example, based on a proportion between a height of the cavity and the IR-wavelength. The geometry of the emitting element may be designed arbitrarily based on trench etching, for example, as a coil, a ring, a meander or the like. According to some embodiments, above-described emitters may be produced in a CMOS-process. The sacrificial layer process for encapsulating may comprise the removal of the sacrificial layer. The removal may be supported by using a material that comprises a high selectivity with respect to the etching rate and with respect to etching rates of surrounding materials. Thus, the complete sacrificial layer may be removed surely even from distant points (trench 44 or 44'). In addition, manufacturing may be achieved by only using dry etching processes, such that problems like sticking will not occur.

One aspect of above described embodiments is an integration of an infrared-emitter using a silicon-on-nothing process. This includes generating of an essentially freestanding structure out of a surficial silicon element. The element may be connected to the substrate with the SON-lamella. According to one embodiment, a thermal emitting layer is arranged at the lamella. The thermal emitting layer may comprise, for example, wolfram, polysilicon, or the like. In this case, the lamella serves as a thermal isolation on the underside.

According to another embodiment, a lateral connection of the emitter is realized through an oxide, wherein the SON-silicon serves as an emitter itself.

According to another embodiment, the emitting silicon element is provided with an encapsulation by executing a carbon-sacrificial-layer-process, wherein the resulting cavity is evacuated and sealed.

Although some aspects have been described in the context of an apparatus, it is clear that these aspects also represent a description of the corresponding method, where a block or device corresponds to a method step or a feature of a method step.

Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An emitter comprising:
a semiconductor substrate having a main surface,
the semiconductor substrate comprising a cavity adjacent to the main surface,
wherein a portion of the semiconductor substrate arranged between the cavity and the main surface of the semiconductor substrate forms a support structure, and
the semiconductor substrate comprising at least one trench at the main surface extending to the cavity;
an emitting element,
a portion of the support structure comprising the emitting element, and
the emitting element being configured to emit a thermal radiation of the emitter,
wherein the cavity provides a reduction of a thermal coupling between the emitting element and the semiconductor substrate; and
a sealing structure at the main surface,
the semiconductor substrate comprising another cavity arranged at the portion of the support structure,
the portion of the support structure being uncovered by the sealing structure, and
the emitting element being arranged between the cavity and the other cavity.

2. The emitter according to claim 1, wherein the semiconductor substrate and the support structure comprise a monocrystalline semiconductor material.

3. The emitter according to claim 1, wherein the support structure is mechanically fixed by the sealing structure or by a sacrificial material different from a material of the semiconductor substrate and not fixed by the semiconductor substrate.

4. The emitter according to claim 1, further comprising an electric connection to the emitting element,
wherein the electric connection is arranged through the sealing structure.

5. The emitter according to claim 1, wherein an atmospheric pressure in the cavity is reduced when compared to an ambient pressure of the emitter.

6. The emitter according to claim 1, wherein the cavity comprises an extension along a direction parallel to a surface normal of the main surface,
the extension being at least 20 nm and at most 1 mm.

7. A sensor comprising:
the emitter of claim 1; and
a sensor element configured for receiving the thermal radiation and for determining a spectral absorption of the thermal radiation of a material arranged between the sensor element and the emitting element,
the spectral absorption caused by the thermal radiation traveling through the material arranged between the sensor element and the emitting element.

8. An emitter comprising:
a semiconductor substrate having a main surface,
the semiconductor substrate comprising a cavity adjacent to the main surface,
wherein a portion of the semiconductor substrate arranged between the cavity and the main surface of the semiconductor substrate forms a support structure, and
the semiconductor substrate comprising at least one trench at the main surface extending to the cavity;
an emitting element on or over the support structure,
the emitting element being configured to emit a thermal radiation of the emitter,
wherein the cavity provides a reduction of a thermal coupling between the emitting element and the semiconductor substrate; and
a sealing structure at the main surface,
the semiconductor substrate comprising another cavity arranged at the portion of the support structure,
the portion of the support structure being uncovered by the sealing structure, and
the emitting element being arranged between the cavity and the other cavity.

9. The emitter according to claim 8, wherein the semiconductor substrate and the support structure comprise a monocrystalline semiconductor material.

10. The emitter according to claim 8, wherein the support structure is mechanically fixed by the sealing structure or by a sacrificial material different from a material of the semiconductor substrate and not fixed by the semiconductor substrate.

11. The emitter according to claim 8, further comprising an electric connection to the emitting element,
wherein the electric connection is arranged through the sealing structure.

12. The emitter according to claim 8, wherein an atmospheric pressure in the cavity is reduced when compared to an ambient pressure of the emitter.

13. A sensor comprising:
the emitter of claim 8; and
a sensor element configured for receiving the thermal radiation and for determining a spectral absorption of the thermal radiation of a material arranged between the sensor element and the emitting element,
the spectral absorption caused by the thermal radiation traveling through the material arranged between the sensor element and the emitting element.

14. An emitter comprising:
a semiconductor substrate having a main surface,
the semiconductor substrate comprising a cavity adjacent to the main surface,
wherein a portion of the semiconductor substrate arranged between the cavity and the main surface of the semiconductor substrate forms a support structure, and
the semiconductor substrate comprising at least one trench at the main surface extending to the cavity;
an emitting element adjacent to the cavity,
the emitting element being configured to emit a thermal radiation of the emitter,
wherein the cavity provides a reduction of a thermal coupling between the emitting element and the semiconductor substrate; and
a sealing structure at the main surface, the semiconductor substrate comprising another cavity arranged at the portion of the support structure, the portion of the support structure being uncovered by the sealing structure, and the emitting element being arranged between the cavity and the other cavity.

15. The emitter according to claim 14, wherein the semiconductor substrate and the support structure comprise a monocrystalline semiconductor material.

16. The emitter according to claim 14, wherein the support structure is mechanically fixed by the sealing structure or by a sacrificial material different from a material of the semiconductor substrate and not fixed by the semiconductor substrate.

17. The emitter according to claim 16, further comprising an electric connection to the emitting element, wherein the electric connection is arranged through the sealing structure.

18. The emitter according to claim 1, further comprising a connection between the cavity and the other cavity through the main surface of the semiconductor substrate.

19. The emitter according to claim 8, further comprising a connection between the cavity and the other cavity through the main surface of the semiconductor substrate.

20. The emitter according to claim 14, further comprising a connection between the cavity and the other cavity through the main surface of the semiconductor substrate.

\* \* \* \* \*